United States Patent
Bulman-Fleming et al.

(10) Patent No.: US 7,239,515 B2
(45) Date of Patent: Jul. 3, 2007

(54) THERMAL ASSEMBLY FOR COOLING AN ELECTRONICS MODULE

(75) Inventors: Jon Bulman-Fleming, Ottawa (CA); John Atkinson, Ottawa (CA)

(73) Assignee: Nortel Networks Limited, St. Laurent (CA)

( * ) Notice: Subject to any disclaimer, the term of this patent is extended or adjusted under 35 U.S.C. 154(b) by 194 days.

(21) Appl. No.: 10/795,496

(22) Filed: Mar. 8, 2004

(65) Prior Publication Data

US 2005/0195571 A1    Sep. 8, 2005

(51) Int. Cl.
  *H05K 7/20* (2006.01)
  *H01L 23/34* (2006.01)
  *F28F 7/00* (2006.01)

(52) U.S. Cl. .............. 361/704; 361/707; 361/709; 361/711; 361/715; 257/718; 165/80.3; 174/16.3

(58) Field of Classification Search ............ 361/704
See application file for complete search history.

(56) References Cited

U.S. PATENT DOCUMENTS

| | | | | |
|---|---|---|---|---|
| 4,415,025 A | * | 11/1983 | Horvath | 165/185 |
| 5,842,512 A | * | 12/1998 | Guerrero | 165/80.3 |
| 6,191,478 B1 | * | 2/2001 | Chen | 257/718 |
| 6,261,485 B1 | * | 7/2001 | Klett | 264/29.6 |
| 6,542,371 B1 | * | 4/2003 | Webb | 361/708 |
| 6,856,511 B1 | * | 2/2005 | Viernes et al. | 361/704 |
| 2002/0114139 A1 | * | 8/2002 | Bash et al. | 361/719 |
| 2003/0002258 A1 | * | 1/2003 | Manabe et al. | 361/704 |

FOREIGN PATENT DOCUMENTS

JP        05013627    *  1/1993

* cited by examiner

*Primary Examiner*—Jayprakash Gandhi
*Assistant Examiner*—Zachary Pape
(74) *Attorney, Agent, or Firm*—Guerin & Rodriguez, LLP; William G. Guerin

(57) ABSTRACT

A thermal assembly for cooling an electronics module is described. The assembly includes a compressible thermal pad, a thermal plate, and a clip. The thermal plate attaches to a heat sink. The clip urges the thermal pad against a surface of the thermal plate. Heat generated by electronics components in the pluggable electronics module is conducted to the heat sink through a thermal path defined by the thermal plate, the compressible thermal pad, and the clip.

14 Claims, 6 Drawing Sheets

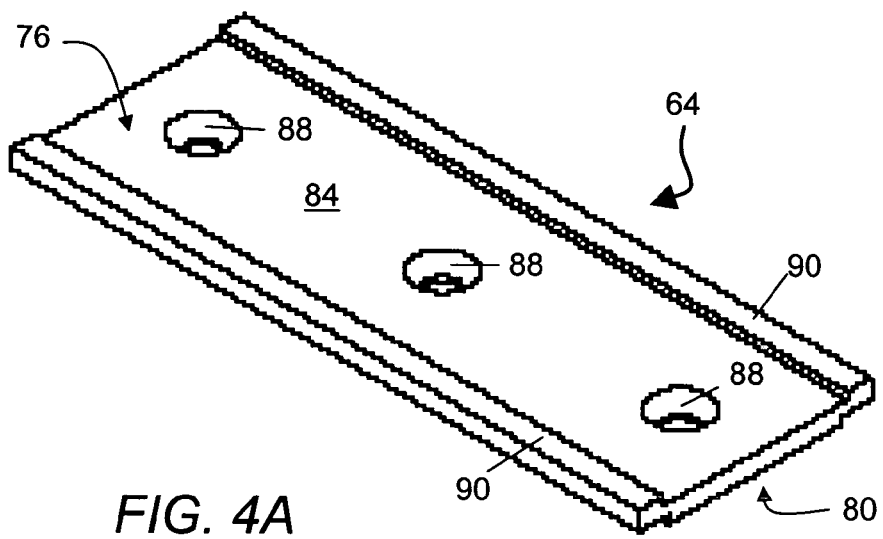
*FIG. 4A*
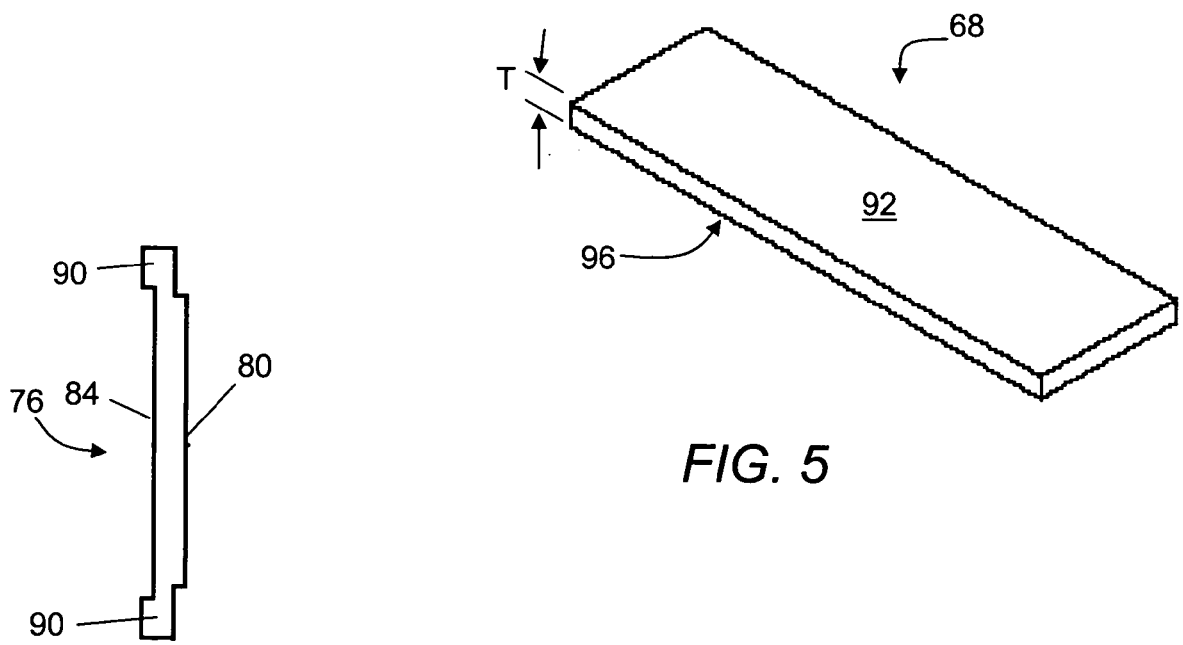
*FIG. 4B*
*FIG. 5*

US 7,239,515 B2

THERMAL ASSEMBLY FOR COOLING AN ELECTRONICS MODULE

FIELD OF THE INVENTION

The invention relates to a thermal assembly for use with a heat sink. More specifically, the invention relates to a thermal assembly for cooling an electronics module.

BACKGROUND OF THE INVENTION

Electronic component manufacturers often work together to develop multi-source agreements (MSA) that describe guidelines for manufacturing various electronics modules. For example, there exists an MSA for dense wavelength division multiplexing (DWDM) pluggable transceiver modules and for XFP (10 gigabit small form factor pluggable module) devices. With reference to FIGS. 1A and 1B, a pluggable transceiver module 10 constructed for DWDM communications includes a top module body 14, a bottom module body 18, a transmit port 22, a receive port 26, and a plurality of heat transfer fins 30. Electronic components, which are enclosed by the top module body 14 and bottom module body 18, can include optical transmitters, optical receivers, and various other electronic circuits which provide the functionality of the pluggable transceiver module 10. The transmit port 22 and the receive port 26 facilitate optical communication between the module 10 and other modules and components of a communications system. The ports 22, 26 are coupled through optical communication paths to the enclosed electronic components. During operation, the electronic components generate heat, which is removed through top module body 14 to permit normal operation of the transceiver module 10. The heat transfer fins 30 extending from the top module body 14 help to dissipate the heat generated by the electronic components. In other transceiver modules, the heat transfer fins 30 are not present. Instead, the top module body 14 is relatively flat in the region where the heat transfer fins 30 are typically located.

In some communications applications, multiple pluggable modules 10 are grouped together in an enclosure. The enclosure typically includes printed circuit boards (PCBs), circuitry, and various devices, which are part of an optical communications system. The top surface of the enclosure often is a heat sink. As the modules 10 are inserted into the enclosure, the heat transfer fins 30 of the pluggable modules 10 make contact with the underside of the heat sink to establish a thermal path to help dissipate the heat generated by the enclosed electronic components. Friction between the heat transfer fins 30 and the underside of the heat sink during insertion is undesirable because it increases the force necessary to insert and remove the pluggable modules 10.

Alternatively, a gap can be maintained between the underside of the heat sink and the heat transfer fins 30. The gap eliminates the friction between the heat transfer fins 30 and the underside of the heat sink module; however, the gap also creates a break in the thermal path between the module 10 the heat sink, resulting in increased component temperature and possibly degraded operation of the module 10.

What is needed is a thermal assembly that reduces friction during insertion and provides a thermal path between the module and the heat sink.

SUMMARY OF THE INVENTION

In one aspect the invention relates to an assembly for cooling an electronics module. The assembly has a compressible thermal pad, a thermal plate, and a clip. The thermal plate has a surface and is configured for coupling to a heat sink. The clip attaches to the thermal plate and surrounds the thermal pad. The clip urges the thermal pad against the surface of the thermal plate to provide a thermal path between the clip and the heat sink.

In yet another aspect, the invention relates to a means for cooling an electronics module. The cooling means includes a rigid means, a compressible means, and a securing means. The rigid means conducts heat to a heat sink and attaches to the heat sink. The compressible means conducts heat from the electronics module. The compressible means is thermally coupled to the rigid means and generates a force normal to the rigid means when in a compressed state. The means for securing secures the compressible means to the rigid means. The securing means surrounds the compressible means and is adapted for thermal contact with the electronics module to conduct heat from the module.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

FIG. 4A is an isometric view of an embodiment of a thermal plate of the thermal assembly of FIG. 3.

FIG. 4B is a side view of the thermal plate of FIG. 4A.

FIG. 5 is an isometric view of a thermal pad of the thermal assembly of FIG. 3.

DETAILED DESCRIPTION

Figure 1A:
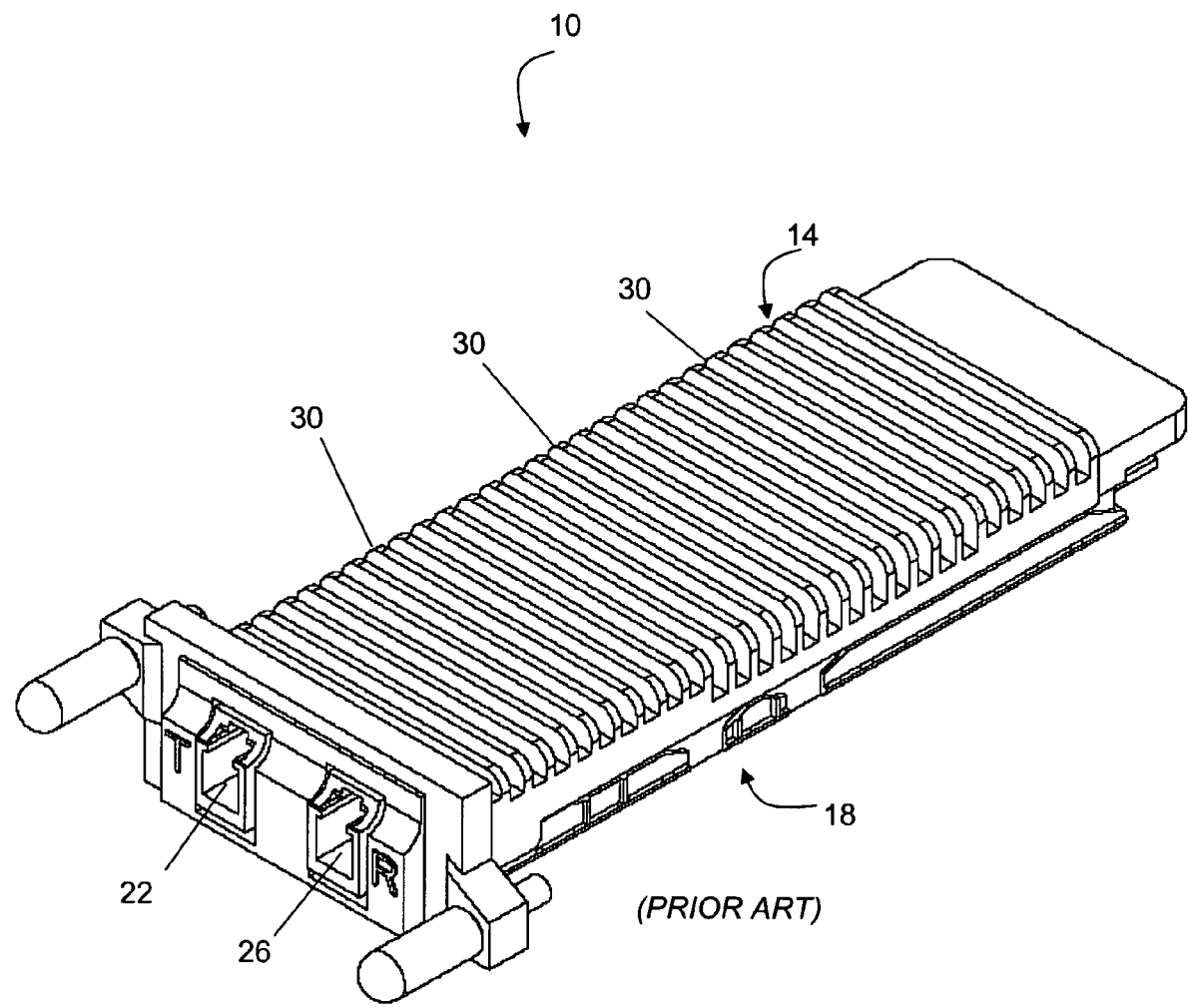
FIG. 1A is an isometric view of a pluggable electronics module.
Figure 1B:
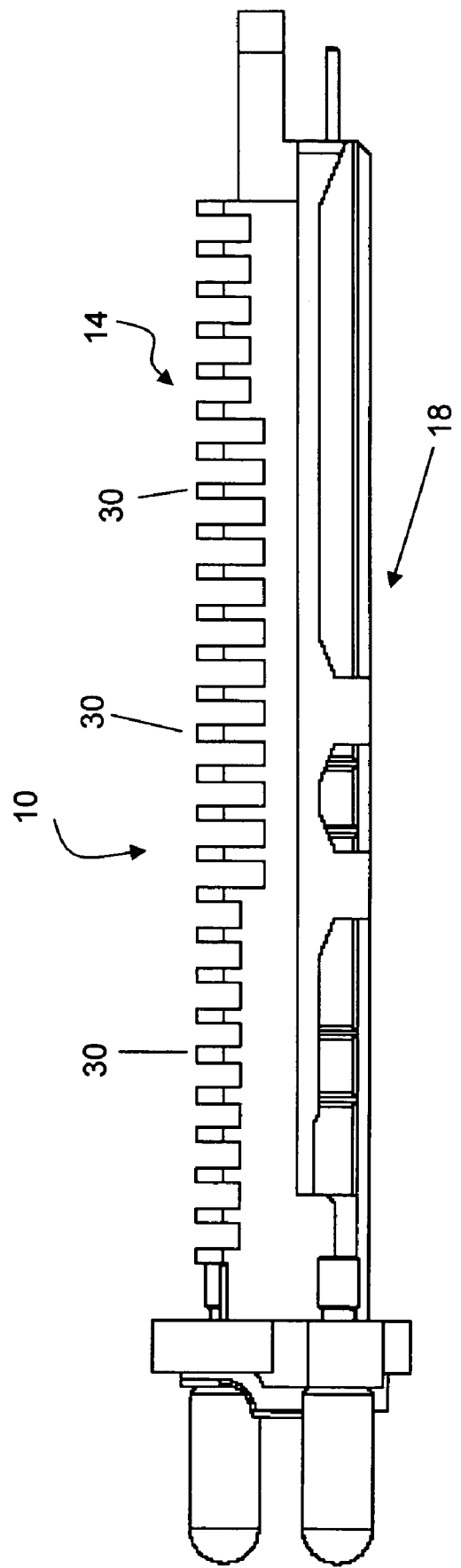
FIG. 1B is a side view of the electronics module of FIG. 1A.
Figure 2:
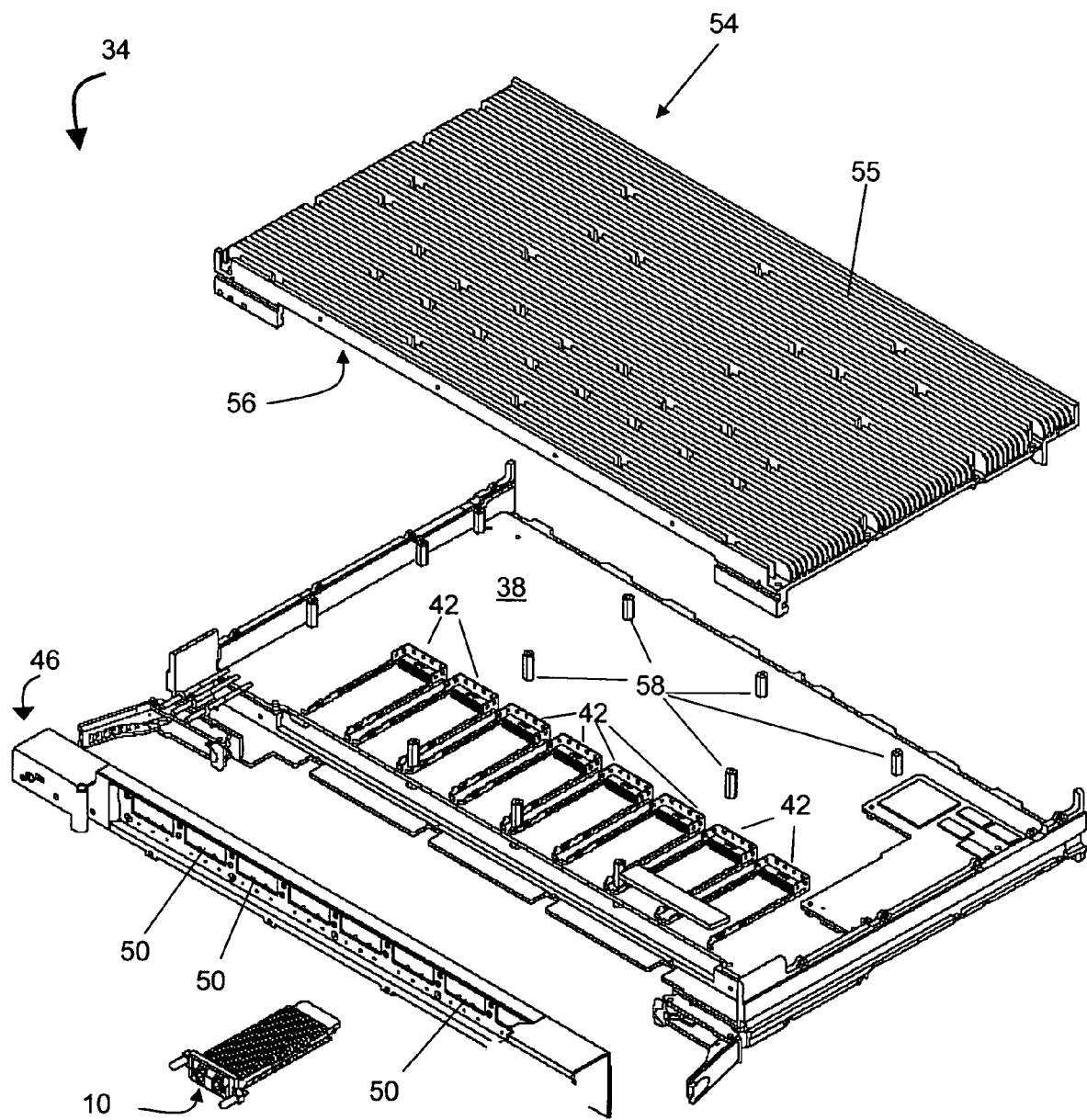
FIG. 2 is an exploded view of a carrier used in a communications system.

In one exemplary configuration, the electronics module 10 is inserted into a carrier 34 as shown in FIG. 2. The carrier 34 includes a PCB 38, a plurality of PCB mount rails 42, an interface panel 46 having a plurality of openings 50 and a heat sink 54. The heat sink 54 includes a topside 55 and an underside 56. The heat sink 54 attaches to the PCB 38 at various attachment points 58. The heat sink 54 does not move once it is attached to the PCB 38. Each electronics module 10 is inserted though a respective opening 50 in the interface panel 46. Each PCB mount rail 42 receives one of the pluggable electronics modules 10. The rear of the pluggable electronics module 10 engages an electrical connector that electrically couples the electronics module 10 to the PCB 38. Once the electronics module 10 is fully inserted, the PCB mount rail 42 assists in maintaining the electronics module 10 in place. However, a gap exists between the heat transfer fins 30 of the module 10 and the underside 56 of the heat sink 54. The gap limits the transfer of heat from the electronics module 10 to the heat sink 54. It is desirable to provide a thermal path between the heat transfer fins 30 to the heat sink 54. The thermal path increases heat transfer and improves the performance of the electronics module 10.

Figure 3:
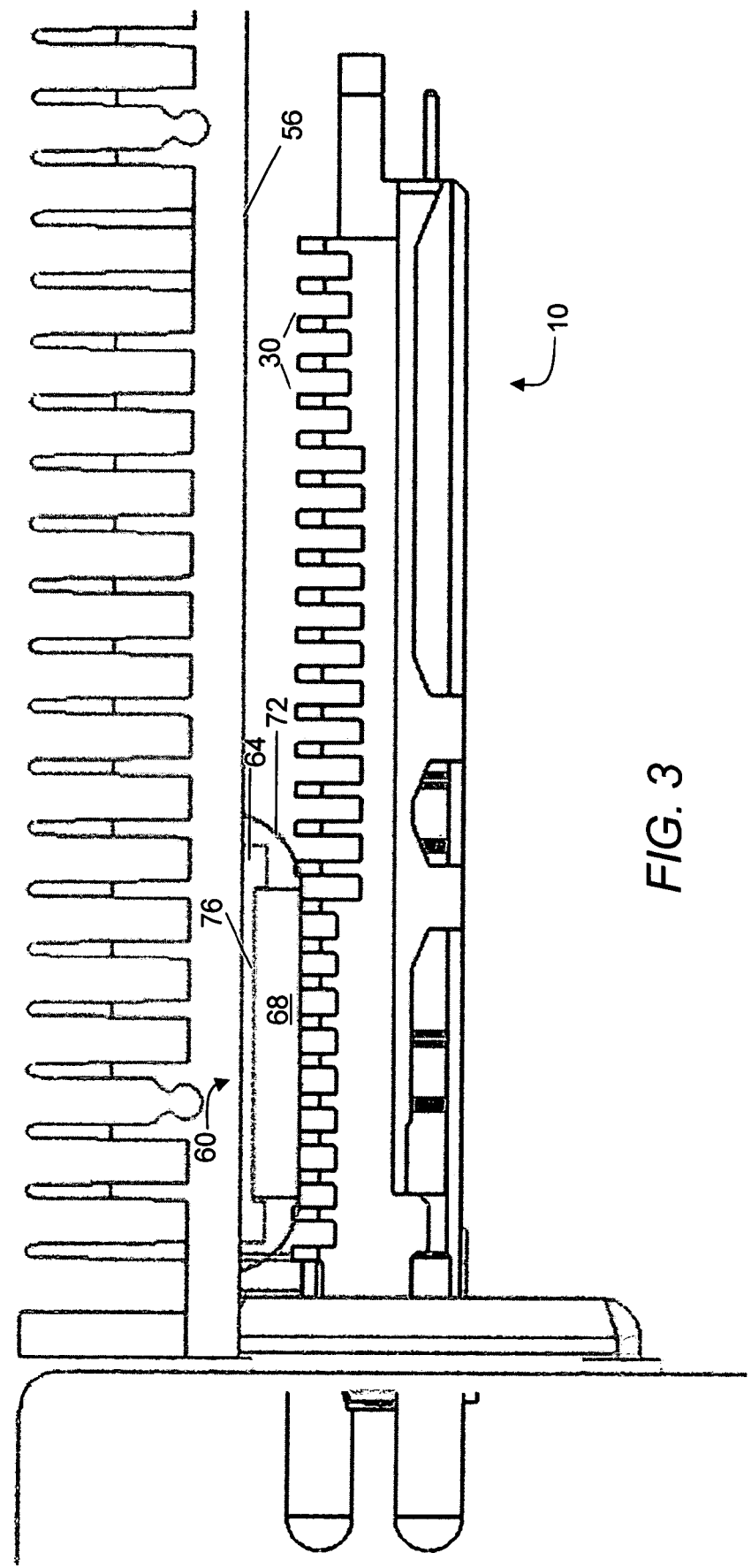
FIG. 3 is a side view of an embodiment of a thermal assembly during use constructed according to the principles of the present invention.

FIG. 3 shows a thermal assembly 60 placed between the heat transfer fins 30 of the pluggable electronics module 10 and the underside 56 of the heat sink 54 to provide the thermal path. The thermal assembly 60 includes a thermal plate 64, a thermal pad 68, and a clip 72, which is also referred to as a retainer 72 throughout the specification. The thermal plate 64 attaches to the underside 56 of the heat sink 54. A groove 76 in the thermal plate 64 receives the thermal pad 68. The thermal plate 64, the thermal pad 68, and the clip 72 provide a thermal path between the module 10 and the heat sink 54. The clip 72 urges the thermal pad 68 into the groove 76 and holds the thermal pad 68 against thermal plate 64. Due to the smooth surface of the clip 72, the friction required to insert the module 10 into the carrier 34 is reduced.

FIGS. 4A and 4B show the thermal plate 64 according to one embodiment. The thermal plate 64 has a first surface 80 that attaches to the underside 56 of the heat sink 54. The thermal plate 64 also has a second surface 84 inside the groove 76. The second surface 84 includes bores 88 to receive fasteners to attach the thermal plate 64 to the underside 56 of the heat sink 54. A pair of ledges 90 extends normal to the second surface 84 and define the groove 76. The ledges 90 and the second surface 84 form a generally C-shaped cross-section. In other embodiments, the ledges 90 and the second surface 84 have a generally V-shaped or U-shaped cross-section. The thermal plate 62 is constructed of a thermally conductive material such as aluminum.

FIG. 5 shows the thermal pad 68 according to one embodiment. The thermal pad 68 has a top surface 92 and a bottom surface 96. The top surface 92 lies against the second surface 84 of the thermal plate 64 when placed in the groove 76 and the bottom surface 96 makes contact the clip 72. In the illustrated embodiment, the thermal pad 68 is rectangular and has a thickness T of 3.5 mm. The thermal pad 68 can have a different shape and thickness depending on the application. The thermal pad 68 is constructed of a thermally conductive and compressible material, such as a silicone elastomer or a thermally conductive foam. In one embodiment, the thermal pad 68 is constructed of SARCON HRD manufactured by Fujipoly America Corporation of Carteret, N.J.

Figure 6A:
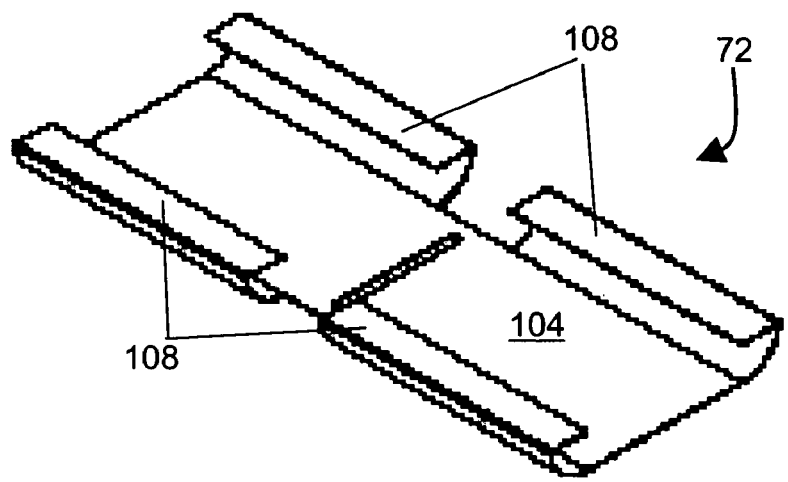
FIG. 6A is an isometric view of an embodiment of a clip of the thermal assembly of FIG. 3.
Figure 6B:
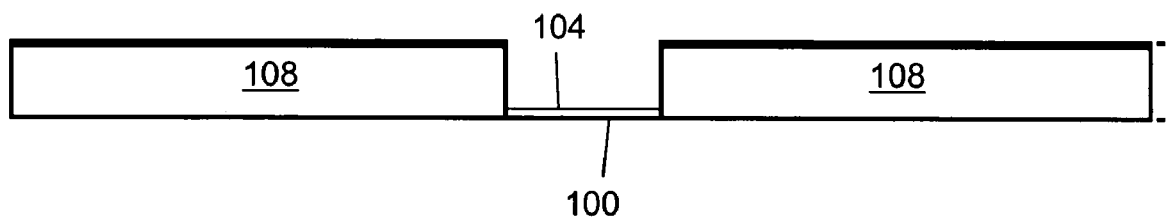
FIG. 6B is a side view of the clip of FIG. 6A.
Figure 6C:
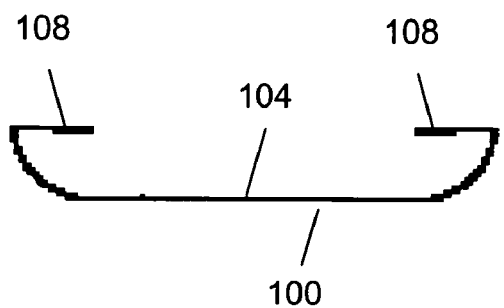
FIG. 6C is an end view of the clip of FIG. 6A

FIGS. 6A, 6B, and 6O illustrate the clip 72 according to one embodiment of the invention. The clip 72 has a first (outer) surface 100, a second (inner) surface 104, and a plurality of flanges 108. The outer surface 100 makes contact with the heat transfer fins 30 when the module 10 is inserted through an opening 50 in the carrier 34. The outer surface 100 is smooth to reduce friction from the heat transfer fins 30 during insertion. The second surface 104 makes contact with the bottom surface 96 of the thermal pad 68. The flanges 108 capture the ledges 90 of the thermal plate 64 when the clip 72 is attached. The flanges 108 can be resilient or rigid and allow the clip 72 to be attached to the thermal plate 64 and removed from the thermal plate 64. As depicted, the clip 72 has a generally C-shaped cross-section, although other cross-sectional shapes can be used. The clip 72 surrounds the thermal pad 68 when attached to the thermal plate 64. Additionally, the clip 72 urges, secures, and restrains the thermal pad 68 against the thermal plate 64. In one embodiment, the clip 72 is constructed of a thermally conductive material, such as beryllium-copper, to achieve a smooth surface. Advantageously, beryllium-copper has a high thermal conductivity and resistance to wear. In other embodiments, other thermally conductive materials are used to construct the clip 72.

While the invention has been shown and described with reference to specific preferred embodiments, it should be understood by those skilled in the art that various changes in form and detail may be made therein without departing from the spirit and scope of the invention as defined by the following claims. For example, the thermal plate 64 can be an integral part of the heat sink 54.

What is claimed is:

1. An assembly for cooling an electronics module comprising:
    a compressible thermal pad;
    a thermal plate having a surface and configured for coupling to a heat sink; and
    a clip attached to the thermal plate, the clip substantially surrounding and in direct contact with the thermal pad and urging the thermal pad against the surface of the thermal plate, the compressible thermal pad, the thermal plate, and the clip providing a serial thermal path between the electronics module and the heat sink.

2. The assembly of claim 1 wherein the thermal pad comprises a silicone elastomer.

3. The assembly of claim 1 wherein the thermal pad comprises a thermally conductive foam.

4. The assembly of claim 1 wherein the clip comprises beryllium-copper.

5. The assembly of claim 1 wherein the clip comprises a thermally conductive, wear-resistant, and lubricious material.

6. The assembly of claim 1 wherein the clip has a generally C-shape cross-section.

7. The assembly of claim 1 wherein the thermal plate comprises aluminum.

8. The assembly of claim 1 wherein the thermal plate is integral to the heat sink.

9. An assembly for cooling an electronics module comprising:
    a rigid means for conducting heat to a heat sink attached to the rigid means;
    a compressible means for conducting heat from the electronics module, the compressible means being thermally coupled to the rigid means, the compressible means generating a force normal to the rigid means when in a compresswed state; and
    a means for securing the compressible means to the rigid means, the means for securing substantially surrounding and in direct contact with the compressible means and adapted for thermal contact with the electronics module, the compressible means,the rigid means, and the meansfor securing providing a serial thermal path between the electronics module and the heat sink.

10. The assembly of claim 9 wherein the means for securing has a generally C-shaped cross-section.

11. The assembly of claim 9 wherein the means for securing comprises beryllium-copper.

12. The assembly of claim 9 wherein the compressible means comprises a thermal pad.

13. The assembly of claim 12 wherein the thermal pad comprises a silicone elastomer.

14. The assembly of claim 12 wherein the thermal pad comprises a thermally conductive foam.

* * * * *